United States Patent
Tang et al.

[11] Patent Number: 6,152,765
[45] Date of Patent: Nov. 28, 2000

[54] ELECTRICAL CONNECTOR

[75] Inventors: Chiu-Yu Tang, Montery Park, Calif.; Jerry Wu, Chang-Hua, Taiwan

[73] Assignee: Hon Hai Precision Ind. Co., Ltd., Taipei Hsien, Taiwan

[21] Appl. No.: 09/305,142

[22] Filed: May 4, 1999

[51] Int. Cl.[7] .................................................. H01R 13/73
[52] U.S. Cl. ........................................... 439/567; 439/570
[58] Field of Search .......................... 439/567, 571–573, 439/83, 570, 569

[56] References Cited

U.S. PATENT DOCUMENTS

| | | | |
|---|---|---|---|
| 5,080,611 | 1/1992 | Hypes | 439/567 |
| 5,154,634 | 10/1992 | Brown et al. | 439/567 |
| 5,297,966 | 3/1994 | Brennian, Jr. et al. | 439/570 |
| 5,387,115 | 2/1995 | Kozel et al. | 439/567 |
| 5,704,807 | 1/1998 | Sherman et al. | 439/570 |
| 5,738,541 | 4/1998 | Tseng | 439/567 |
| 6,007,352 | 12/1999 | Azuma et al. | 439/570 |

*Primary Examiner*—Gary F. Paumen
*Attorney, Agent, or Firm*—Wei Te Chung

[57] ABSTRACT

An electrical connector (1/1A) for either through hole mounting or surface mounting comprises a common dielectric housing (10), a plurality of terminals (12) retained therein, and a pair of securing devices (20 or 120) mutually exclusively fixed in the housing. The securing devices are either a pair of board locks (21) or a pair of soldering pads (121). A mounting face (10b) of the housing forms two pairs of standoffs (15) at its opposite ends, and each pair of standoffs defines an opening (15a) therebetween. A retaining recess (14) is defined in the housing within each opening. The boardlocks (21) or soldering pads (121) each form a base portion (21a or 122) which engages with a retaining recess. A fork portion (21b) of each board lock engages with a retaining hole in a circuit board for through hole mounting, and a soldering portion (123) of each soldering pad engages with a mounting pad of a circuit board for surface mounting.

1 Claim, 4 Drawing Sheets

ELECTRICAL CONNECTOR

FIELD OF THE INVENTION

The invention relates to an electrical connector, and more particularly to an electrical connector suitable for through-hole or surface mounting.

DESCRIPTION OF PRIOR ART

According to specifications of the PC industry, there are two types of host signal plug connectors: surface mounted or through-hole mounted. Surface mounted connectors include a pair of soldering pads extending from the connector while through hole mounted connectors include a pair of board locks which extend from the connector into mounting holes defined in a printed circuit board. Both types of connectors can have identical terminal arrangements.

SUMMARY OF THE INVENTION

It is an objective of the present invention to provide an electrical connector which can be mounted by surface mounting or through hole mounting.

In order to achieve the objective set forth, an electrical connector comprises a dielectric housing having mating and mounting faces. A plurality of terminal passageways is formed between said mating and mounting faces, each being assembled with a terminal therein. Two pairs of spaced standoffs are integrally formed on opposite ends of said mounting face and each pair of standoffs defines an opening therebetween. A retaining recess is formed in the housing within each opening for assembling a securing device therein for connecting to a printed circuit board.

According to one aspect of the present invention, the securing device is a soldering pad having a soldering portion extending through the opening between the standoffs. According to a second aspect of the present invention, the securing device is a board lock having a fork portion for engaging with a retaining hole of a circuit board.

These and additional objects, features, and advantages of the present invention will become apparent after reading the following detailed description of the preferred embodiment of the invention taken in conjunction with the appended drawing.

DETAILED DESCRIPTION OF PREFERRED EMBODIMENT

Figure 1:
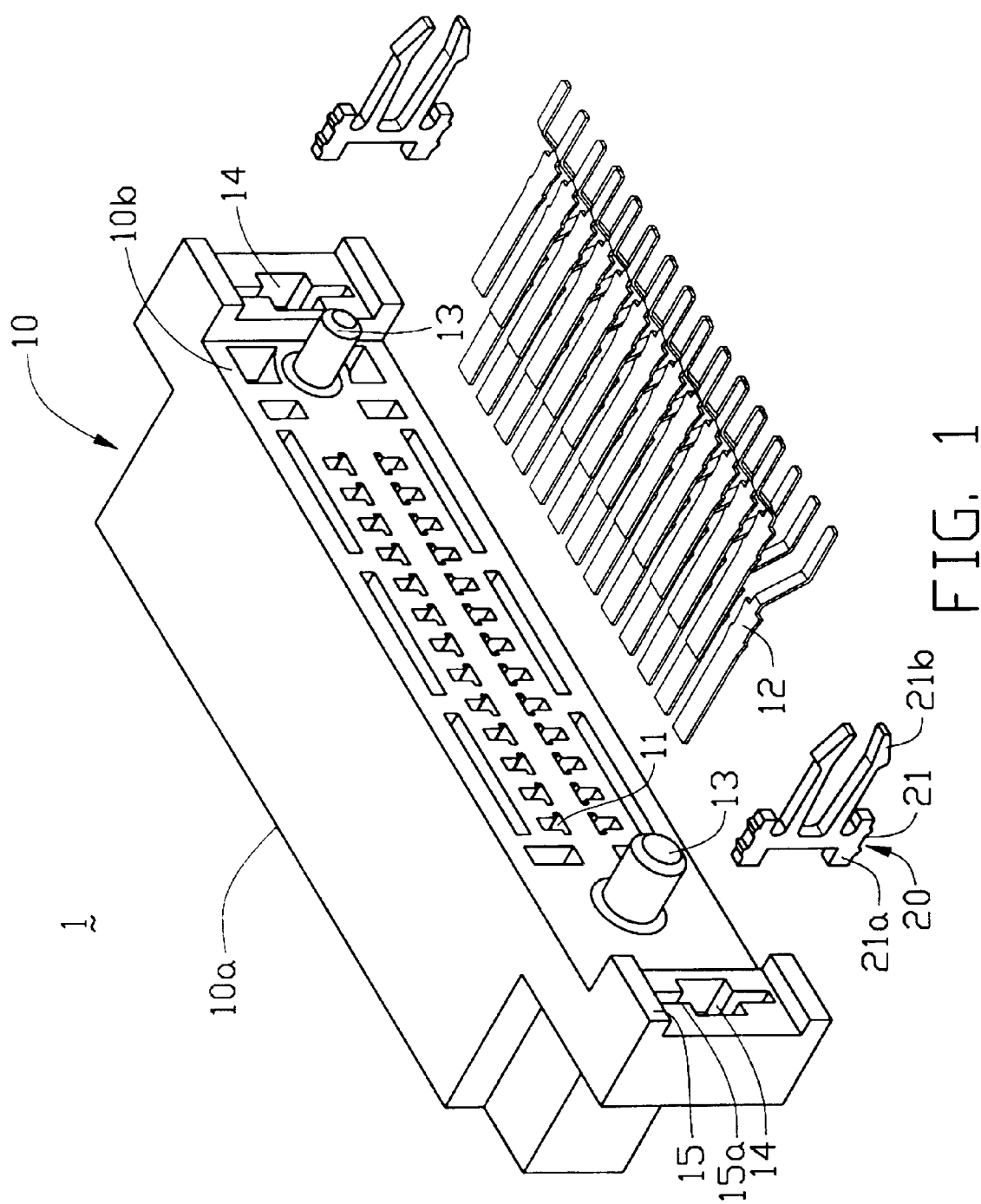
FIG. 1 is an exploded view of an electrical connector in accordance with a first aspect of the present invention.
Figure 2:
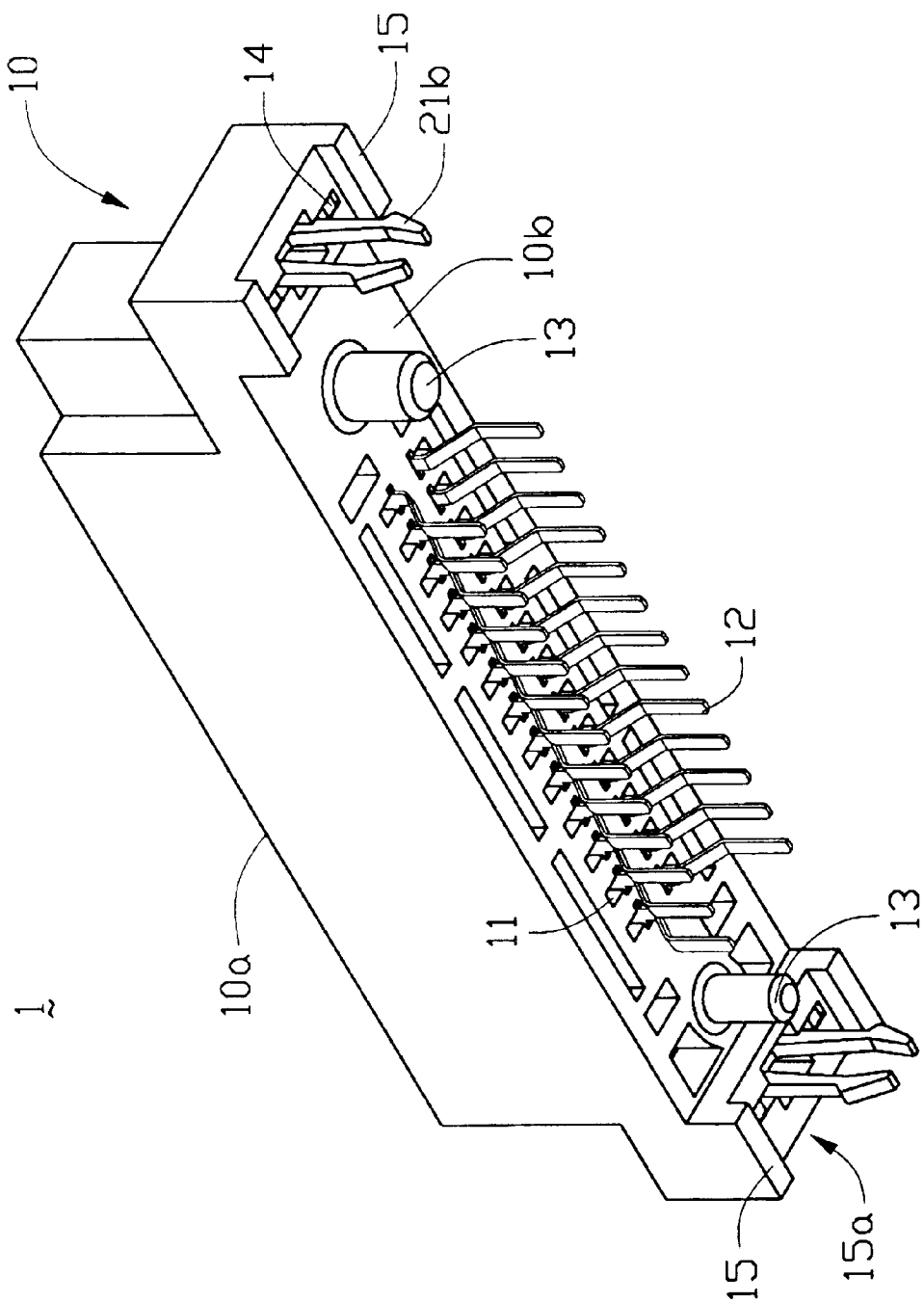
FIG. 2 is an assembled view of the electrical connector of FIG. 1.
Figure 4:
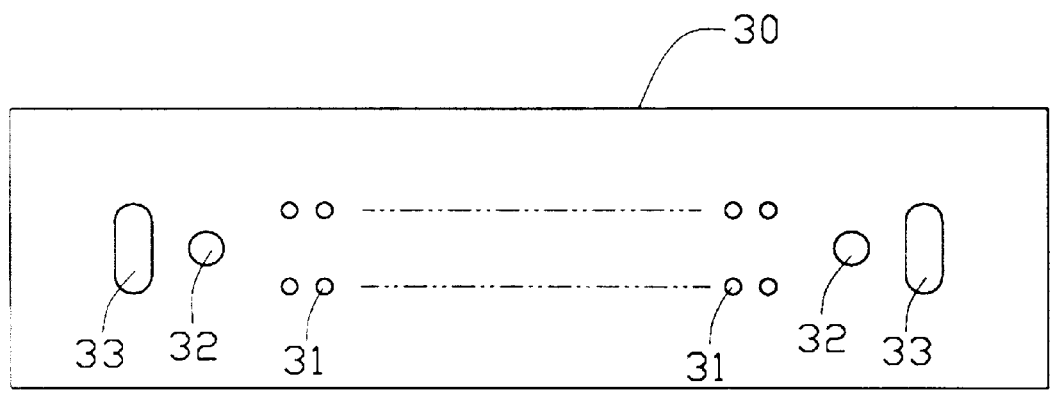
FIG. 4 is a first layout on a printed circuit board for mounting the electrical connector of FIG. 1.

Referring to FIGS. 1 and 2, an electrical connector 1 in accordance with the present invention comprises a dielectric housing 10 having mating and mounting faces 10a and 10b. A plurality of terminal passageways 11 is formed between said mating and mounting faces 10a and 10b. Each passageway 11 is assembled with a terminal 12 therein. A pair of positioning posts 13 is formed on the mounting face 10b for assembling to mounting holes 32 of a printed circuit board 30 (FIG. 4). Two pairs of spaced standoffs 15 are integrally formed on opposite ends of the mounting face 10b and each pair of standoffs 15 defines an opening 15a therebetween. A pair of retaining recesses 14 is formed in said mounting face 10b, one retaining recess in each opening 15a, for retaining a securing device 20 for connecting to the printed circuit board 30. The securing device 20 is a board lock 21 which includes a base portion 21a retained in the retaining recess 14 and a fork portion 21b to be received in a retaining hole 33 (FIG. 4) of the printed circuit board 30. The connector 1 shown in FIGS. 1 and 2 is for through-hole mounting.

Figure 3:
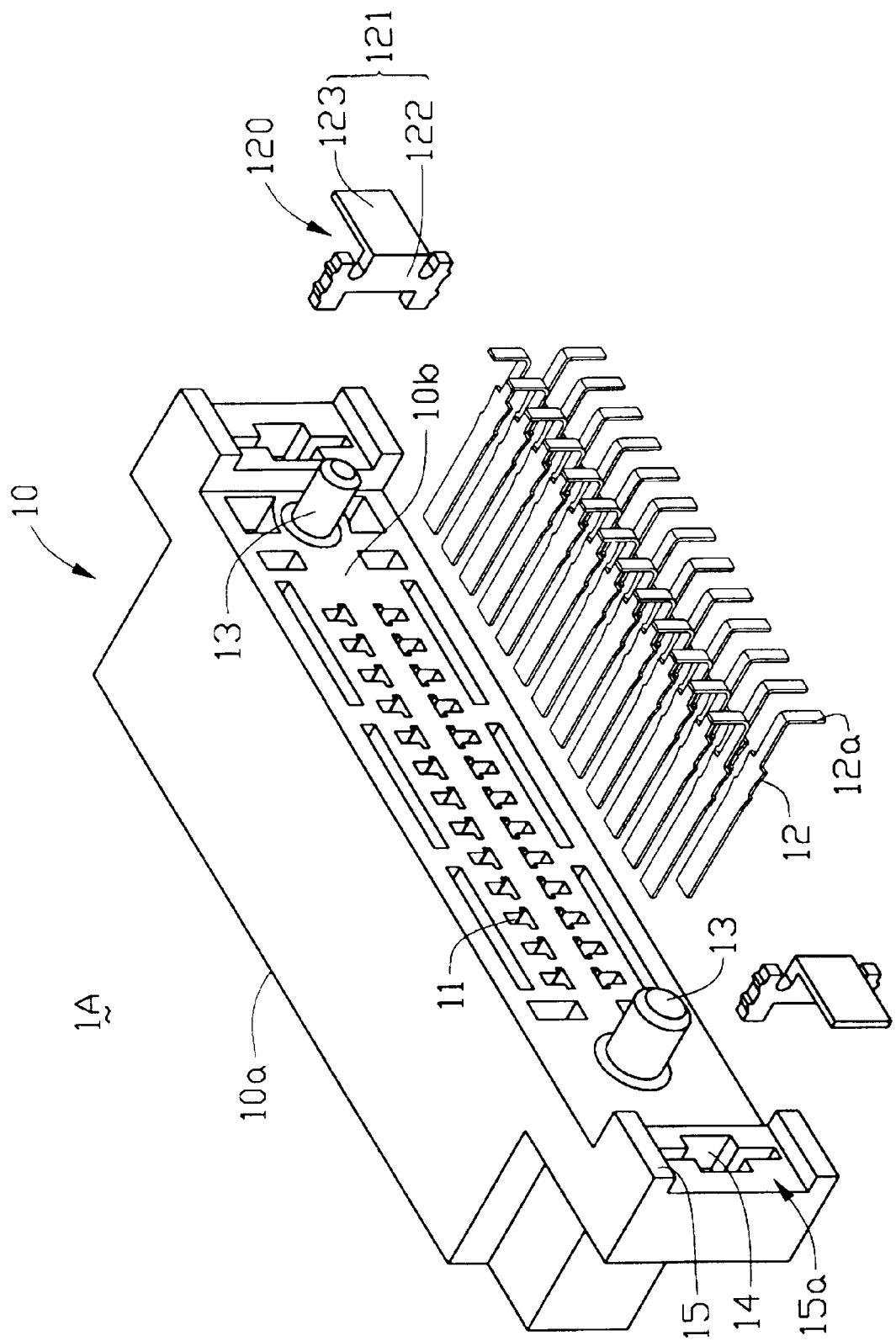
FIG. 3 is an exploded view of an electrical connector in accordance with a second aspect of the present invention.
Figure 5:
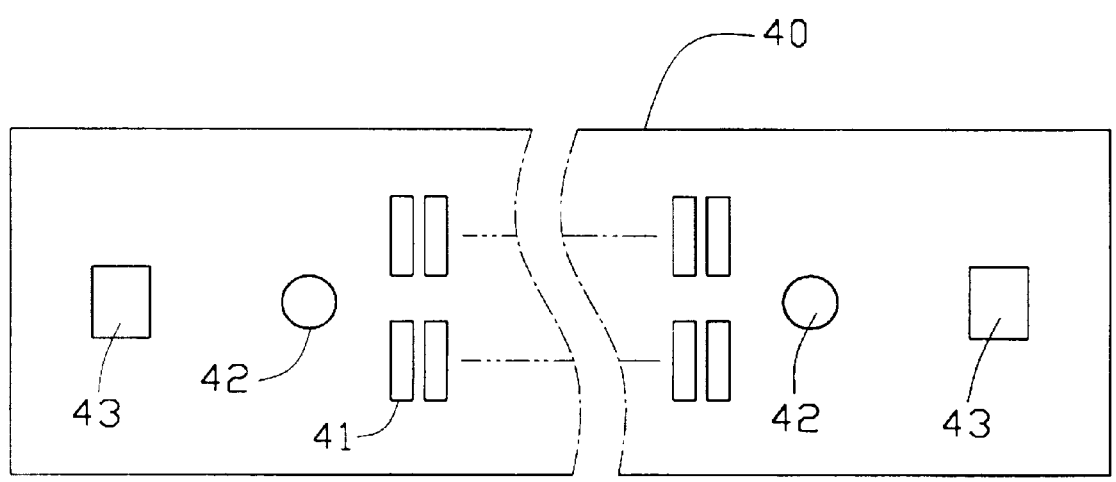
FIG. 5 is a second layout on a printed circuit board for mounting the electrical connector of FIG. 3.

Referring to FIGS. 3 and 5, a connector 1A for surface mounting in accordance with the present invention includes a dielectric housing 10 having mating and mounting faces 10a and 10b. A plurality of terminal passageways 11 is formed between said mating and mounting faces 10a and 10b. Each passageway 11 is assembled with a terminal 12 therein. A pair of positioning posts 13 is formed on the mounting face 10b for assembling to mounting holes 42 of a printed circuit board 40. Two pairs of spaced standoffs 15 are integrally formed on opposite ends of the mounting face 10b and each pair of standoffs 15 defines an opening 15a therebetween. A pair of retaining recesses 14 is formed in said mounting face 10b, one retaining recess in each opening 15a, for retaining a securing device 120 for connecting to the printed circuit board 40. The opening 15a should be communicative to an exterior to allow the securing device 120 to extend beyond the housing for engagement between the securing device 120 and the corresponding circuit board 40. The securing device 120 in connector 1A is a soldering pad 121. The soldering pad 121 includes a base portion 122 securely retained in the retaining recess 14 and a soldering portion 123 extending through the opening 15a between the standoffs 15 and beyond the housing 10. The soldering portion 123 allows connection to a mounting pad 43 (FIG. 5) on the printed circuit board 40. In addition, terminals 12 assembled in the housing 10 can be bent horizontally (not shown) such that a soldering tail 12a formed thereon can be surface mounted.

FIG. 4 shows a layout on the printed circuit board 30 for through-hole-mounting the electrical connector 1 thereon. The printed circuit board 30 includes an array of through holes 31 for mounting of the terminals 12, a pair of mounting holes 32 for mounting the positioning posts 13, and a pair of retaining holes 33 for mounting the board locks 21 therein. Each through hole 31 is electrically connected to a conductive lead (not shown) on the printed circuit board 30. The mounting holes 32 have differing inner diameters for anti-misorientation, i.e., preventing upside-down mounting of the electrical connector 1 thereon. The positioning posts 13 of the connector 1 likewise have differing outside diameters corresponding respectively to the inside diameters of the mounting holes 32. In this embodiment, the retaining holes 33 align with the retaining recesses 14 of the connector 1.

FIG. 5 shows a layout on the printed circuit board 40 for surface-mounting the electrical connector 1A thereon. The printed circuit board 40 includes an array of conductive pads 41 for mounting of the terminals 12, a pair of mounting holes 42 for mounting the positioning posts 13, and a pair of mounting pads 43 for soldering the soldering portions 123 thereon. The mounting holes 42 have differing inner diameters corresponding to the differing outside diameters of the positioning posts 13 for anti-misorientation, i.e., preventing upside-down mounting of the electrical connector 1A thereon. Since the soldering portion 123 extends through the opening 15a defined between the standoffs 15 and beyond the housing 10, the surface mounting process can be easily performed.

By this arrangement, with the same housing 10 but with different securing devices, either board locks 21 or soldering pads 121, the connectors 1/1A can be assembled to the printed circuit boards 30/40 using through-hole or surface mounting techniques. It should be noted that the invention includes a system, comprising two different printed circuit boards 30/40, an identical housing 10 with differently bent terminals 12, and different securing devices 20/120, wherein the connective portions on the different securing devices correspond to the different mounting arrangements on the circuit boards 30/40. Note that the mounting pads 43 should be spaced further apart on the printed circuit board 40 than corresponding retaining holes 33 on the printed circuit board 30, since the soldering portions 123 are further apart on the connector 1A than are the fork portions 21b on the connector 1. This arrangement allows use of one type of housing to implement these two types of mounting techniques, thereby saving manufacturing cost.

While the present invention has been described with reference to specific embodiments, the description is illustrative of the invention and is not to be construed as limiting the invention. Various modifications to the present invention can be made to the preferred embodiment by those skilled in the art without departing from the true spirit and scope of the invention as defined by the appended claims.

We claim:

1. An electrical system, comprising:

an electrical connector comprising:

a dielectric housing for common use with both a first printed circuit board (first PCB) and a second printed circuit board (second PCB), the housing having a mating face and a mounting face, a plurality of terminal passageways formed through the housing, a pair of posts protruding from the mounting face, two pairs of spaced standoffs integrally extending from opposite ends of said mounting face, each pair of standoffs defining an opening therebetween, and a retaining recess formed in each said opening;

a plurality of terminals for assembly into corresponding terminal passageways; and a pair of board locks and a pair of soldering pads for being mutually exclusively received within the corresponding pair of retaining recesses of said housing, each board lock and each soldering pad having a base portion for being assembled in said retaining recess, each board lock being for connecting to the first PCB and each soldering pad being for connecting to the second PCB; and a first PCB and a second PCB for being mutually exclusively used with, respectively, the connector assembled with the pair of board locks and the connector assembled with the pair of soldering pads, wherein:

the first PCB has a pair of retaining holes receiving the pair of board locks, a pair of mounting holes located between the retaining holes and receiving the pair of posts, and an array of conductive means located between the mounting holes and each electrically connecting with a mounting tail of a corresponding terminal; and the second PCB has a pair of mounting pads connecting with the pair of soldering pads, a pair of mounting holes located between the mounting pads and receiving the pair of posts, and an array of conductive means located between the mounting holes and each electrically connecting with a mounting tail of a corresponding terminal;

wherein each said soldering pad comprises a soldering portion connected to the base portion, said soldering portion extending through said opening between said standoffs and beyond the housing;

wherein each said board lock comprises a fork portion connected to the base portion, said fork portion extending into a retaining hole of said first PCB, each retaining hole of the first PCB aligning with a corresponding retaining recess of the housing.

* * * * *